United States Patent [19]

Itoh et al.

[11] Patent Number: 5,468,969
[45] Date of Patent: Nov. 21, 1995

[54] METHOD AND APPARATUS FOR ELECTRON BEAM LITHOGRAPHY

[75] Inventors: Hiroyuki Itoh, Katsuta; Hideo Todokoro, Tokyo; Yasunari Sohda, Hachiouji; Yoshinori Nakayama, Sayama, all of Japan

[73] Assignee: Hitachi, Ltd., Tokyo, Japan

[21] Appl. No.: 153,157

[22] Filed: Nov. 17, 1993

[30] Foreign Application Priority Data

Nov. 19, 1992 [JP] Japan ................. 4-309121

[51] Int. Cl.$^6$ ............................................. H01J 37/04
[52] U.S. Cl. ................. 250/492.23; 250/492.22; 250/491.1; 250/397
[58] Field of Search ............. 250/492.2, 492.23, 250/492.22, 492.3, 491.1, 398, 397, 548

[56] References Cited

U.S. PATENT DOCUMENTS

| | | | |
|---|---|---|---|
| 4,443,703 | 4/1984 | Shimazu et al. | 250/491.1 |
| 4,967,088 | 10/1990 | Stengl et al. | 250/491.1 |
| 5,036,209 | 7/1991 | Kataoka et al. | 250/492.2 |
| 5,047,647 | 9/1991 | Itoh et al. | 250/491.1 |
| 5,130,550 | 7/1992 | Nakamura et al. | 250/492.2 |
| 5,168,166 | 12/1992 | Hayakawa et al. | 250/492.2 |
| 5,298,761 | 3/1994 | Aoki et al. | 250/548 |
| 5,301,124 | 4/1994 | Chan et al. | 250/491.1 |

*Primary Examiner*—James Beyer
*Attorney, Agent, or Firm*—Fay, Sharpe, Beall, Fagan, Minnich & McKee

[57] ABSTRACT

Electron beam lithography for exposure of a group of elemental openings in a collective-exposure shaping diaphragm is intended to correct the positional deviation of the group of elemental openings quickly and economically.

A rectangular beam is formed by rectangle openings made in a rectangle forming diaphragm and a group of elemental openings in a collective-exposure shaping diaphragm and used for irradiating a reference mark on a workpiece stand. Electrons reflected from the reference mark are detected by a reflecting electron detector to calculate errors in the configuration and position of the rectangular beam. The results of calculation are fed back to a shaping deflector and a positioning deflector to correct errors in the configuration and position of the rectangular beam, respectively. Moreover, an arrangement of the groups of elemental openings is detected by mechanically scanning the collective-exposure shaping diaphragm so as to correct an error in the rotation of the collective-exposure shaping diaphragm.

7 Claims, 4 Drawing Sheets

METHOD AND APPARATUS FOR ELECTRON BEAM LITHOGRAPHY

BACKGROUND OF THE INVENTION

The present invention relates generally to electron beam lithography, and more particularly to electron beam lithography for transferring a complicated repetitive pattern at a time by emitting an electron beam through one group among a plurality of groups of openings in a collective-exposure shaping diaphragm.

For decreasing frequency of replacing shaping diaphragms, prolonging their life and increasing processing speed at the time electron beam lithography is implemented, recent electron beam lithography apparatuses are arranged so that the electron beam shaped by a rectangle forming diaphragm is emitted through one group of elemental openings among a plurality of groups of them in a collective-exposure shaping diaphragm to transfer a complicated repetitive pattern at a time as in the case of a memory cell.

In the method of collectively transferring such a pattern through the group of elemental openings, mechanical moving and positioning mechanisms have been used to select a desired group of elemental openings by moving the collective-exposure shaping diaphragm because of a narrow range in which the electron beam passed through the rectangle forming diaphragm deflects. The electron beam generated by an electron beam source is formed into an image on the collective-exposure shaping diaphragm and the image thus formed is passed through the group of elemental openings in the collective-exposure shaping diaphragm. As a result, the configuration of the beam passed through the collective-exposure shaping diaphragm changes with the group of elemental openings.

Given that desired positioning accuracy on the surface of a workpiece is x and that a beam reduction ratio from the collective-exposure shaping diaphragm up to the surface of the workpiece is M, the positioning accuracy X of the diaphragm moving mechanism becomes x/M.

In the prior art, the collective-exposure shaping diaphragm is moved by mechanically driving the diaphragm moving mechanism. Consequently, an error x in positioning the group of elemental openings on the surface of the workpiece is settled within a predetermined range by holding the accuracy in a predetermined range.

With the prior art arrangement above, however, it has hardly been possible to satisfactorily minimize the positioning error X.

In other words, the mechanical control accuracy needs improving in conformity with the desired positioning accuracy x on the workpiece and this practice has been unpractical because the mechanical mechanism tends to become too complicated. Moreover, the position of the group of elemental openings has necessitated being precisely detected.

In a case where a diaphragm as a replacement has a setting error, where the group of elemental openings are irregularly arranged or the like, the arrangement and positions of such openings will have to be detected. Therefore, there arise problems including making the mechanical mechanism complicated and increasing the positioning time required.

SUMMARY OF THE INVENTION

An object of the present invention made to solve the foregoing problems typical of the prior art is to improve positioning accuracy by detecting the positions of openings in a collective-exposure shaping diaphragm so as to correct a positioning error automatically or electronically at the time the diaphragm is moved or replaced with a new one.

In order to solve the problems above, an electron beam is emitted through one group of elemental openings in the diaphragm to obtain a beam of a predetermined shape. Then a reference mark is scanned with the beam thus obtained to calculate the quantity of correction from the reflected signal and the beam is deflected in accordance with the quantity of correction.

Subsequently, a rectangular electron beam is emitted through a rectangular opening in the group of elemental openings in such a way that the former and the latter are overlapped to obtain a beam of a predetermined rectangular shape. Then the reference mark is scanned with the rectangular beam so as to calculate an error in the configuration of the rectangular beam and the quantity of positional deviation thereof from the signal reflected in a reflecting electron detector for mark detection and from reference values of the shape and position of the rectangular beam. Further, the error in the configuration of the rectangular beam is fed back to a shaping deflector to correct the shape, whereas the quantity of positional deviation is fed back to a positioning deflector to correct the position.

In this case, the waveform of the signal reflected in the reflecting electron detector for mark detection should preferably be displayed.

Moreover, an error in the rotational position of the diaphragm should be detected for correction from a plurality of reflected signals in the reflecting electron detector for mark detection which are obtainable by scanning the plurality of groups of elemental openings in the diaphragm.

The signal reflected in the reflecting electron detector for mark detection gives a reference mark position signal on a workpiece stage.

Since one of the two edges of the reflected signal corresponds to one edge of the rectangle forming diaphragm, the shape (width) of the rectangular beam is corrected by correcting the position of the rectangle forming diaphragm.

Since the center position between the two edges of the reflected signal gives the position of the rectangular beam, the positional error is corrected by the positioning deflector.

The error in the configuration of the rectangular beam is obtainable by comparing the edge-to-edge gap of the reflected signal with the reference value of the prestored shape.

Likewise, the quantity of positional deviation of the rectangular beam is obtainable by comparing the center position between the two edges of the reflected signal with the reference value of the prestored position.

Moreover, emission of the rectangular beam onto the reference mark is monitored by displaying the reflected signal waveform in the reflecting electron detector for mark detection.

Further, a rotational error in the plane of the collective-exposure shaping diaphragm is detected by scanning the plurality of groups of elemental openings in the diaphragm so as to make clear the inclination of the arrangement thereof.

The signal reflected in the reflecting electron detector for mark detection is used to make the shaping deflector correct the error in the configuration of the rectangular beam electronically and besides the positioning deflector is used to correct the positional error electronically, whereby the diaphragm can be positioned accurately without further increasing the precision of the diaphragm moving mechanism.

Since a simple rectangular beam is used to detect the workpiece or the reference mark on the workpiece stage, the calculation of the center position of the reference mark is simplified.

In addition, any one of the openings can easily be selected from a collective-exposure shaping diaphragm as a replacement.

The error in the rotation of the diaphragm can promptly be corrected as it is easily calculable from such an arrangement of the groups of elemental openings in the collective-exposure shaping diaphragm as is detected by the reflecting electron detector for mark detection.

As set forth above, the collective-exposure shaping diaphragm can be positioned promptly and economically.

DETAILED DESCRIPTION OF THE PREFERRED EMBODIMENT

Figure 1:
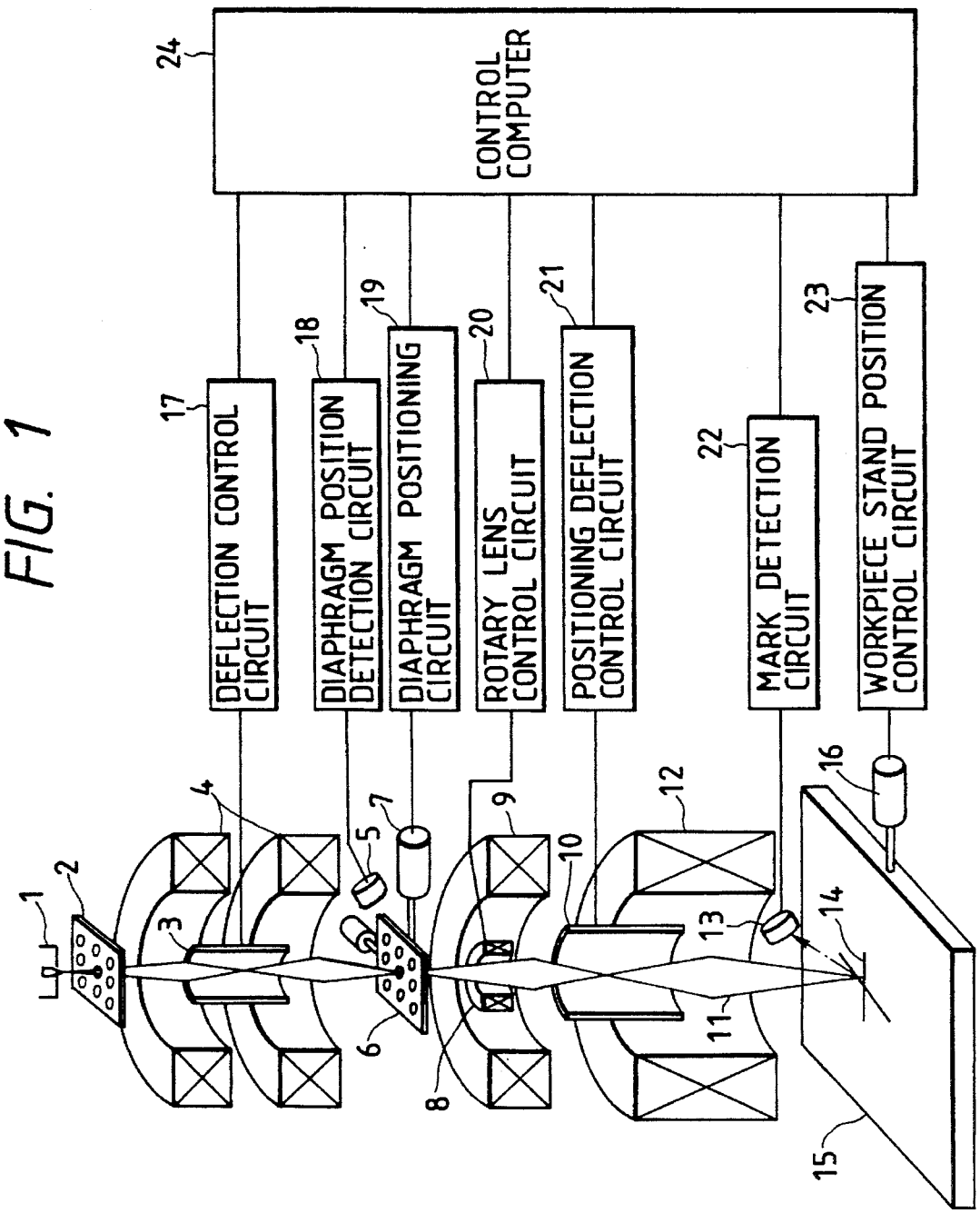
FIG. 1 is a diagrammatic view of an electron beam lithography apparatus.

FIG. 1 is a diagrammatic view of an electron beam lithography apparatus.

An electron beam generated by an electron beam source 1 is shaped into a rectangular by a rectangle forming diaphragm 2, and it passes through a shaping lens 4 to form an image on collective-exposure shaping diaphragm 6. Then a shaping deflector 3 is driven by a deflection control circuit 17 to move the image thus formed so that it is passed through a group of elemental openings in the diaphragm 6.

Consequently, the configuration of the beam passed through the diaphragm 6 varies with the group of elemental openings therein. In a case where the diaphragm 6 is a single rectangle, for example, any desired beam rectangular in shape is obtained by varying the overlapping of two rectangles. When a group of elemental openings in the diaphragm 6 having a repetitive pattern is selected, moreover, a collective transfer beam is obtained.

The beam 11 passed through the diaphragm 6 is reduced by a demagnifying lens 9 and projected by an objective lens 12. Then a positioning deflector 10 and a workpiece stand 15 are used to expose a microscopic pattern to the beam at a desired position on the surface of the workpiece.

Moreover, a reference mark 14 is arranged on the workpiece or the workpiece stand 15 and scanned by means of the positioning deflector 10, so that the position of the beam 11 relative to the workpiece is determined by a reflecting electron detector 13 for detecting reflected electrons.

More specifically, the positional deviation of the beam 11 is calculated from an output waveform from a mark detection circuit 22 and the result of calculation is fed back to a positioning deflection control circuit 21 so as to swing back the beam 11 to a correct position of irradiation. A series of these correcting operations is performed by a control computer 24 at high speed.

FIG. 2 is a top view of an exemplary collective-exposure shaping diaphragm 6.

Figure 2A:
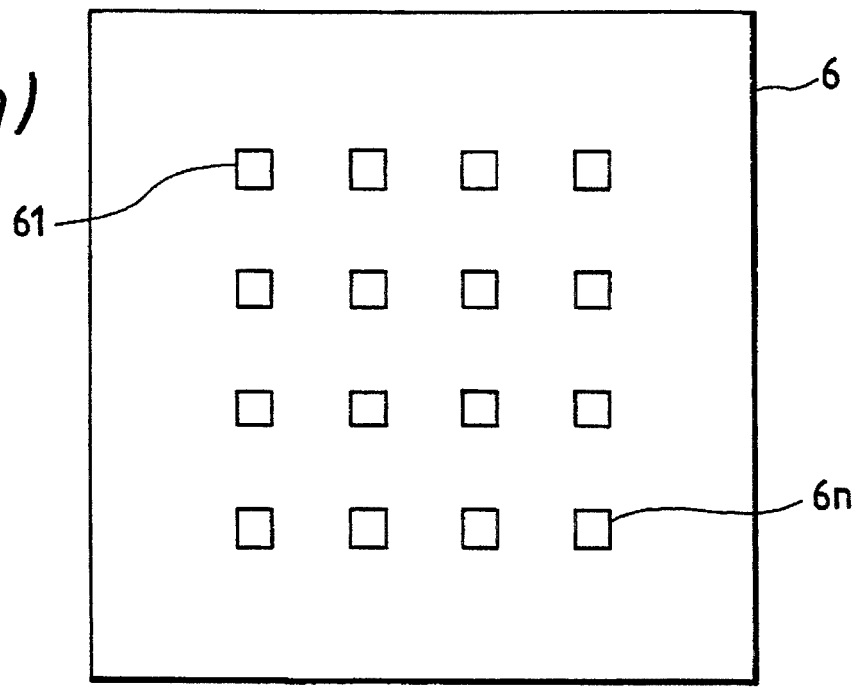
FIG. 2 is a top view of a collective-exposure shaping diaphragm.

As shown in FIG. 2(a), there are provided a plurality of groups of elemental openings 61~6n in the diaphragm 6 according to the applicable kind of electron beam lithography.

Figure 2B:
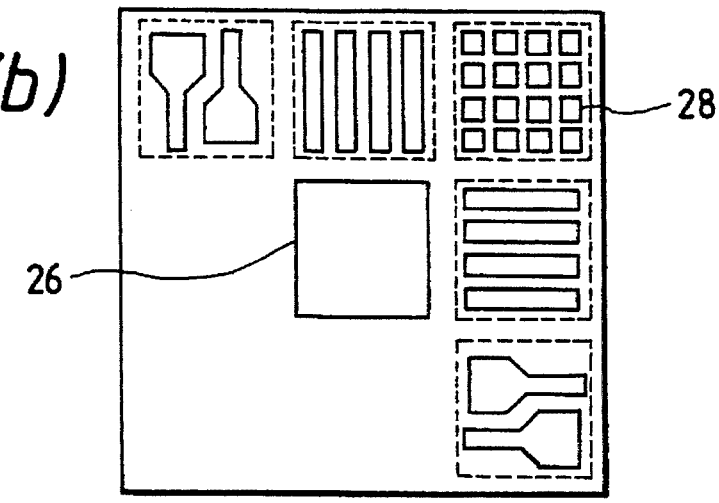

As shown in FIG. 2(b), moreover, each group of elemental openings include at least one rectangular opening 26 in the central portion and a plurality of collective exposure openings 28 around the rectangular opening 26, these being selected by tile shaping deflector 3.

As already shown in FIG. 1, the diaphragm 6 is mechanically moved by a diaphragm moving mechanism 7 to select a desired group of elemental openings 27.

Since the positioning accuracy X of the diaphragm moving mechanism 7 becomes x/M on the assumption that desired positioning accuracy on the surface of a workpiece is set as x and a beam reduction ratio from the diaphragm up to the surface of the workpiece as M, the positioning accuracy X of the diaphragm moving mechanism 7 becomes 2.5 μm, provided x=0.1 pm and M= 1/25.

In this case, the positioning error x in the group of elemental openings on the workpiece may be settled to approximately 0.1 μm by making a pulse motor drive the diaphragm moving mechanism 7, thus moving the diaphragm 6 with an accuracy of about several μm.

When the desired positioning accuracy x on the workpiece reaches 0.01 μm, for example, X=0.25 μm is required, so that the control accuracy of the pulse motor is raised accordingly. However, the mechanical mechanism may become complicated and the position of the group of elemental openings needs detecting precisely.

Figure 3:
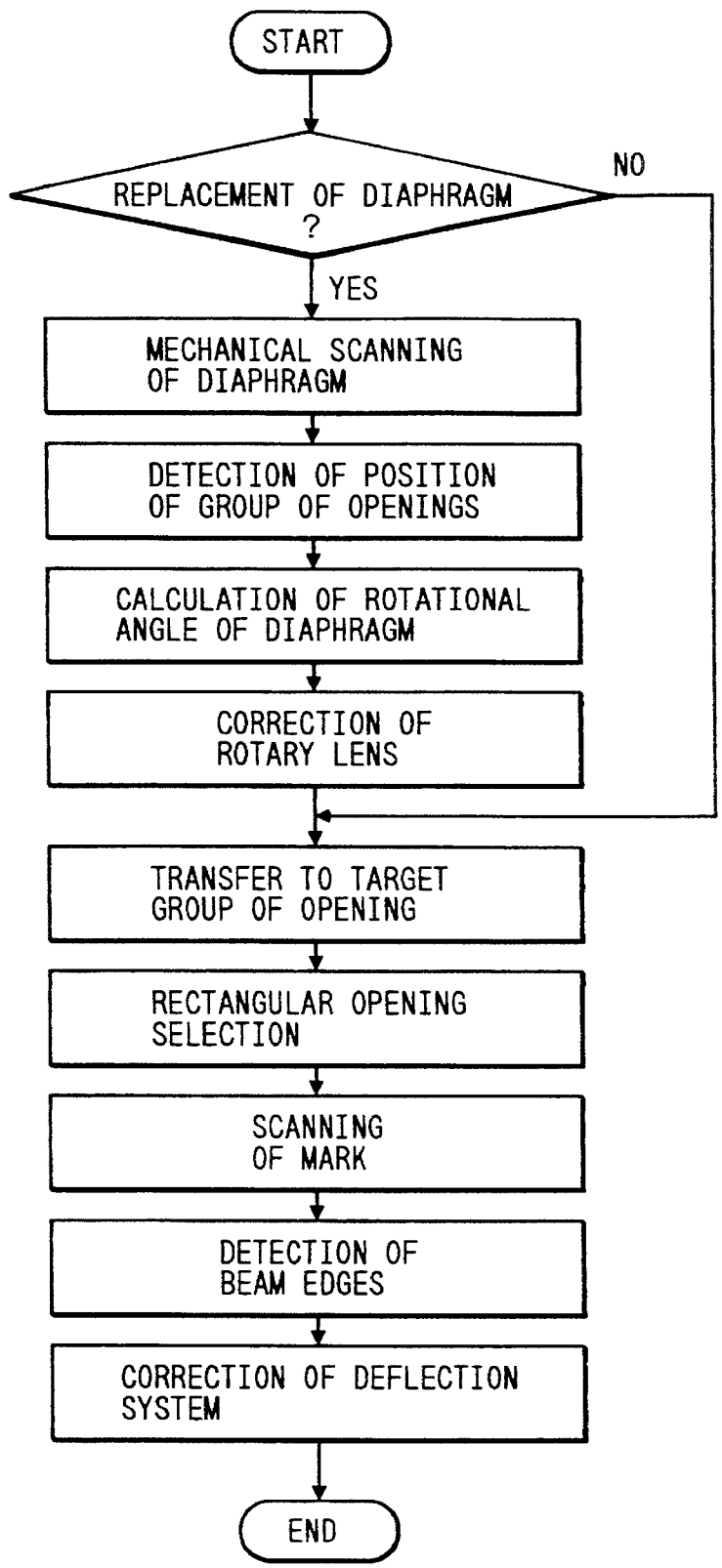
FIG. 3 is a flowchart of electron beam lithography.

FIG. 3 is a flowchart showing a procedure for positioning groups of elemental openings according to the present invention. When the collective-exposure shaping diaphragm 6 is replaced with a new one, the diaphragm 6 is mechanically scanned by the diaphragm moving mechanism 7 and the positions of the groups of elemental openings 61~6n are detected by means of a reflecting electron detector 5 or the reflecting electron detector for mark detection 13.

Figure 4:
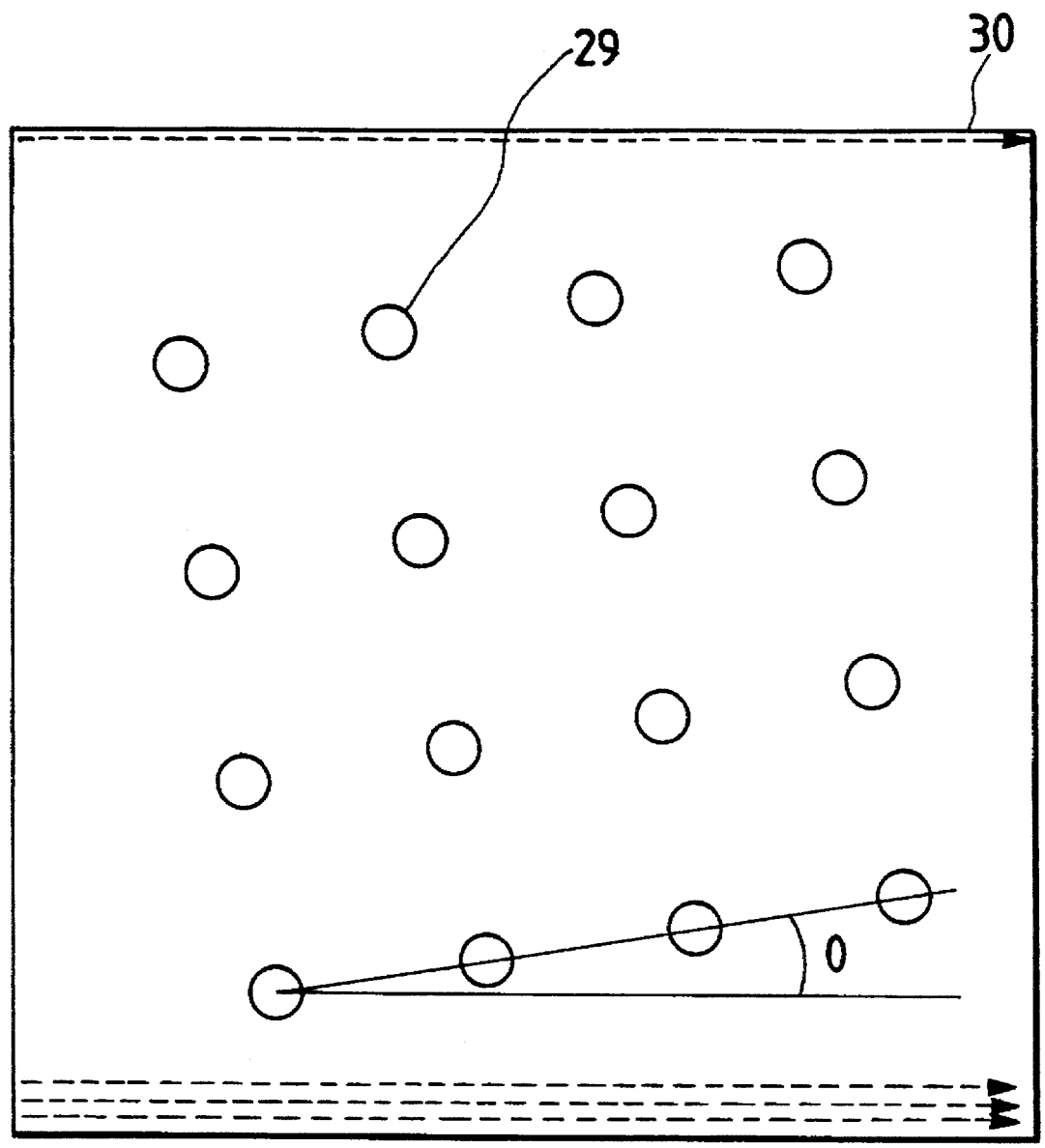
FIG. 4 is a diagram illustrating a scanning pattern of a plurality of groups of elemental openings in the collective-exposure shaping diaphragm.

FIG. 4 is a diagram illustrating an example of an image of the groups of elemental openings for scanning.

Numeral 30 denotes a mechanical scanning range normally including all of the groups of elemental openings. However, it depends on the intended object to scan a specific group of elemental openings or an alignment mark on the surface of the diaphragm 6 and only the periphery thereof.

With the provision of a rotary encoder fitted to the diaphragm moving mechanism 7, an image signal may be taken in if a signal synchronizing the output of the encoder is detected.

In addition, the position of each group of elemental openings is obtained from the peak position of the output waveform from the reflecting electron detector and stored so as to furnish reference data when any group of elemental openings is selected.

In FIG. 2, an angle of rotation Θ of the diaphragm 6 is calculated from the position of the group of elemental openings of FIG. 4 and angle data is input via a rotary lens control circuit 20 to a rotation correcting lens 8 so as to correct an error in the rotation of the beam 11.

The latter half of FIG. 2 shows a procedure for correcting the positional error when the group of elemental openings is selected.

As shown in FIG. 2, the rectangular openings 26 are provided in the groups of elemental openings 61–6n, respectively. Further, the rectangular beam formed by the rectangle forming diaphragm 2 is so emitted as to partially overlap the former and the latter to obtain a beam of a desired rectangular shape. Then the positioning deflector 10 is used to scan the reference mark on the workpiece, and the error in the configuration of the rectangular beam as well as the quantity of positional deviation thereof is calculated from the reflected signal in the reflecting electron detector for mark detection and the results of calculation are used to correct the error and the deflection.

More specifically, a control computer 24 stores, as reference values, the value of configuration of the rectangular beam passing through the rectangular opening 26 and the set value of the position where the reference mark is irradiated, calculates the actual value of configuration of the rectangular beam and the actual position where the reference mark is irradiated from the reflected signal in the reflecting electron detector 13 for mark detection, compares the results of calculation with the respective reference values to calculate an error in the configuration of the rectangular beam and the quantity of positional deviation thereof, corrects the error in the configuration of the rectangular beam by feeding back the error to the shaping deflector 3, and corrects the quantity of positional deviation by feeding it back to the positioning deflector 10.

Since the simplest rectangular opening 26 in configuration out of the group of collective exposure openings 28 is used for position alignment in the above method, the reflected signal in the reflecting electron detector 13 for mark detection has a symmetrical trapezoidal waveform and this makes it possible to calculate the center position of the reference mark easily from the edges of the trapezoidal waveform. Consequently, the rectangular beam, that is, the collective-exposure shaping diaphragm 6 can be positioned with an accuracy of 0.01 μm or less.

Since the positioning of the diaphragm 6 is electronically carried out, it is unnecessary to increase the mechanical precision of the diaphragm moving mechanism 7; therefore, any conventional diaphragm moving mechanism is usable.

Accordingly, the present invention is also applicable to a rectangle forming diaphragm 2 having a number of openings.

Moreover, the state in which the reference mark is being irradiated with the rectangular beam can be monitored by displaying the reflected signal waveform from the reflecting electron detector for mark detection.

On the other hand, the use of the collective exposure opening 28 in the group of collective exposure openings 28 results in making the reflected signal waveform from the reflecting electron detector 13 for mark detection asymmetrical and complicated. Therefore, the procedure for calculating the position of the reference mark becomes complicated and tends to induce errors.

What is claimed is:

1. Electron beam lithography method comprising the steps of:

selecting a first opening from a group of openings in a first collective-exposure shaping diaphragm by mechanically moving the first collective-exposure shaping diaphragm, emitting an electron beam through the first selected opening, deflecting the electron beam from the first selected opening to scan a reference mark and detecting electrons reflected from said reference mark for obtaining position data, comparing the position data with reference data to obtain position correction data;

deflecting the electron beam from the first selected opening in accordance with the correction data; and wherein the first collective-exposure shaping diaphragm is replaced with a second diaphragm and said correction data is obtained with respect to said second diaphragm.

2. Electron beam lithography method as claimed in claim 1, wherein a rectangular opening is provided in said first collective-exposure shaping diaphragm, the electron beam being emitted through said rectangular opening in said step of obtaining position data.

3. Electron beam lithography method as claimed in claim 1, further including calculating a quantity of correction with respect to the rotation of the collective-exposure shaping diaphragm.

4. Electron beam lithography method as claimed in claim 3, wherein the collective-exposure shaping diaphragm is provided with openings which are arranged at a predetermined angle with respect to a scanning direction of said beam, the electron beam being emitted through the openings.

5. Electron beam lithography method as claimed in claim 1, wherein a signal having a trapezoidal waveform is generated in said detecting step, and edges of the waveform are detected for calculating the center position of the reference mark.

6. In electron beam lithography, a method for aligning the position of a collective-exposure shaping diaphragm, comprising the steps of:

emitting a rectangular electron beam through a collective exposure opening formed in a collective exposure shaping diaphragm with a shaping deflector;

scanning a reference mark with the electron beam after passing the electron beam through the collective-exposure shaping diaphragm with a positioning deflector;

detecting electrons reflected from the reference mark in accordance with said scanning;

said emitting including passing the rectangular electron beam through a rectangular opening in the collective exposure shaping diaphragm in an overlapped manner to obtain a beam of a predetermined rectangular shape;

said scanning including scanning the reference mark with the predetermined rectangular shaped beam and detecting the electrons reflected from the reference mark to obtain data;

comparing the data with reference data to determine an error in the configuration of the rectangular beam with respect to the reference data, including positional deviation data;

adjusting said shaping deflector in accordance with the error for correcting the shape and the positional deviation of the collective exposure shaping diaphragm; and detecting an error in the rotational position of the collective exposure shaping diaphragm.

7. An electron beam lithography method as claimed in claim 6, further including displaying a wave form of a signal output in said detecting step.

* * * * *